(12) United States Patent
Woolard et al.

(10) Patent No.: US 6,178,362 B1
(45) Date of Patent: Jan. 23, 2001

(54) ENERGY MANAGEMENT SYSTEM AND METHOD

(75) Inventors: John W. Woolard, Richmond, VA (US); Dale M. Fong, Alameda, CA (US); Patrick L. Dell'Era, Fairfax, CA (US); Keith E. Gipson, Los Angeles, CA (US)

(73) Assignee: Silicon Energy Corp., Alameda, CA (US)

( * ) Notice: Under 35 U.S.C. 154(b), the term of this patent shall be extended for 0 days.

(21) Appl. No.: 09/160,223

(22) Filed: Sep. 24, 1998

(51) Int. Cl.[7] .................................................. G05D 29/00
(52) U.S. Cl. .............................. 700/295; 700/28; 700/31; 700/83; 700/286; 700/291
(58) Field of Search .................................. 700/9, 22, 28, 700/29, 30, 31, 83, 291, 295, 296, 297, 298

(56) References Cited

U.S. PATENT DOCUMENTS

| | | | | |
|---|---|---|---|---|
| 5,404,136 | * | 4/1995 | Marsden | 340/870.03 |
| 5,572,438 | * | 11/1996 | Ehlers et al. | 364/492 |
| 5,706,191 | * | 1/1998 | Bassett et al. | 364/138 |
| 5,761,083 | * | 6/1998 | Brown, Jr. et al. | 364/492 |
| 5,958,012 | * | 9/1999 | Battat et al. | 364/492 |

* cited by examiner

*Primary Examiner*—William Grant
*Assistant Examiner*—Bethew B. Jennings
(74) *Attorney, Agent, or Firm*—Gray Cary Ware & Freidenrich LLP

(57) ABSTRACT

An energy and facilities management system and method is provided for energy users with large physical plants which provides these energy users with a comprehensive understanding of the energy consumption of their physical plant and with the ability to manage it in a way that makes sense for their business. The system may include three dimensional facilities navigation tools, powerfill energy consumption analysis processes, TCP/IP communication capabilities and a World Wide Web (WWW)-based interface. The system also includes a real-time data retrieval and dissemination process and system which permits real-time energy data to be communicated within the system.

19 Claims, 9 Drawing Sheets

| TABLE | FIELD | FIELD TYPE | IDENTITY COLUMN | PK | FK | NOTES |
|---|---|---|---|---|---|---|
| SITE | | | | | | |
| | DESCRIPTION | VARCHAR(50) | | | | UNIQUE DESCRIPTION OF SITE |
| | SITEID | LONG | TRUE | TRUE | | NUMERIC HANDLE FOR SITE |
| LOCATION | | | | | | |
| | TAG | VARCHAR(50) | | | | UNIQUE SHORT NAME FOR LOCATION |
| | LOCATIONID | LONG | TRUE | TRUE | | HANDLE TO LOCATION |
| | SITEID | LONG | | | SITE.SITEID | NUMERIC HANDLE FOR SITE |
| | DESCRIPTION | VARCHAR(50) | | | | DESCRIPTION OF LOCATION |
| | NUMFLOORS | LONG | | | | NUMBER OF FLOORS IN BUILDING |
| | SQFEET | LONG | | | | SQUARE FEET IN BUILDING |
| | TEXTURETYPE | VARCHAR(50) | | | | TEXTURE TO USE FOR RENDERING BUILDING |
| | DEMANDTHRESHOLD | DOUBLE | | | | WARNING LIMIT ON READING |
| | GROUP | LONG | | | | GROUP THAT THE LOCATION IS A MEMBER OF |
| SYSTEM | | | | | | |
| | DESCRIPTION | VARCHAR(50) | | | | UNIQUE DESCRIPTION OF THIS SYSTEM |
| | SYSTEMID | LONG | TRUE | TRUE | | HANDLE TO THIS SYSTEM |
| | LOCATIONID | LONG | | | LOCATION.LOCATIONID | HANDLE TO LOCATION |
| STATICPOINTDATA | | | | | | |
| | NAME | VARCHAR(64) | | | | UNIQUE CHARACTER STRING NAME |
| | PTID | LONG | TRUE | TRUE | | IDENTIFICATION FOR THE POINT |
| | SYSTEMID | LONG | | | SYSTEM.SYSTEMID | HANDLE TO THE OWNING SYSTEM |
| | GROUP | LONG | | | | LOGICAL GROUP FOR POINT |
| | PRIORITY | LONG | | | | WEIGHTING VALUE FOR POINT |
| | SORTCODE | LONG | | | | WHATEVER... |
| | EU | VARCHAR(15) | | | | TEXT REPRESENTATION OF ENGINEERING UNIT |
| DYNAMICPOINTDATA | | | | | | |
| | PTID | LONG | | TRUE | STATICPOINT.PTID | IDENTIFICATION FOR THE POINT |
| | VALUE | DOUBLE | | | | FLOATING POINT VALUE OF THE POINT |
| | MINVALUE | DOUBLE | | | | HIGHEST VALUE OF THE POINT FOR THE INTERVAL |
| | MAXVALUE | DOUBLE | | | | LOWEST VALUE OF THE POINT FOR THE INTERVAL |
| | AVGVALUE | DOUBLE | | | | AVERAGE VALUE OF THE POINT FOR THE INTERVAL |
| | TIMESTAMP | DATE | | | | TIME SET BY DATA SOURCE |
| | STATUS | LONG | | | | STATUS OF THE POINT |
| | PTTYPE | LONG | | | | TYPE OF POINT THIS ENTRY REPRESENTS |
| | ARCHIVE | BOOLEAN | | | | FLAG TO INCLUDE IN HISTORICAL ARCHIVING PROCESS |

| TABLE | FIELD | FIELD TYPE | IDENTITY COLUMN | PK | FK | NOTES |
|---|---|---|---|---|---|---|
| ACCUMULATORDATA | | | | | | |
| | PTID | LONG | | TRUE | STATICPOINT.PTID | IDENTIFICATION FOR THE POINT |
| | DELTAPTID | LONG | | | | ID FOR THE DELTA VALUE OF THE ACCUMULATOR POINT |
| | ROCPTID | LONG | | | | ID FOR THE RATE OF CHANGE VALUE OF THE ACCUMULATOR |
| | DELTAMULTIPLIER | DOUBLE | | | | MULTIPLIER FOR CALCULATING DELTA PSEUDO-POINT |
| CONTROLPOINTDATA | | | | | | |
| | PTID | LONG | | TRUE | STATICPOINT.PTID | IDENTIFICATION FOR THE POINT |
| | CMDTIMEOUT | LONG | | | | NUMBER OF MILLISECONDS TO ALLOW BEFORE DECLARING THE CONTROL COMMAND AS TIMED OUT |
| | CMDINPROGRESS | BOOLEAN | | | | COMMAND CURRENTLY IN PROGRESS? |
| | TIMESTAMP | DATE | | | | TIME SET BY DATA SOURCE |
| | PARAM1 | LONG | | | | CONTROL PARAMATER 1 |
| | PARAM2 | LONG | | | | CONTROL PARAMATER 2 |
| OBJECTREGISTRY | | | | | | |
| | MONIKERNAME | VARCHAR(128) | | TRUE | | FILE MONIKER FOR REGISTERED OBJECT |
| | MACHINENAME | VARCHAR(32) | | TRUE | | MACHINE WHERE OBJECT IS LOCATED |
| | HENSRTDB | LONG | | | TRUE | REAL TIME DATABASE HANDLE FOR THIS OBJECT |
| | OBJECTTYPE | LONG | | | | ENUMERATION TO INDICATE WHAT TYPE OF OBJECT IS REPRESENTED BY THIS ENTRY |
| | RUNNINGSTATE | LONG | | | | STATUS OF OBJECT: STOPPED, RUNNING, PAUSED |
| RTDBSERVERREGISTRY | | | | | | |
| | MACHINENAME | VARCHAR(50) | | TRUE | | UNIQUE NAME OF THE MACHINE THAT HOSTS AN RTDB SERVER |
| | MACHINEID | LONG | | | | TCP/IP ADDR OF HOST MACHINE REPRESENTED AS LONG WORD |
| | HENSRTDB | LONG | | | | REAL TIME DATABASE HANDLE FOR LOCAL RTDB FROM MACHINENAME RTDB |

240 — ACCUMULATORDATA
242 — CONTROLPOINTDATA
244 — OBJECTREGISTRY
246 — RTDBSERVERREGISTRY

ENERGY MANAGEMENT SYSTEM AND METHOD

BACKGROUND OF THE INVENTION

This invention relates generally to a system and method for managing the use of energy and in particular to a system and method for automatically managing the use of energy for a commercial user.

The problem of energy management and energy cost management has always been an issue for many commercial users who operate large physical plants (i.e., facilities and/or factories) because of the large amount of energy which is consumed by the facilities or factories. It is desirable to manage and analyze the energy consumption of the physical plant in order to reduce the total energy costs of the physical plant. The energy management process may involve many steps such as, for example, purchasing energy from another less expensive source or adjusting the energy usage of the facility to off-peak times when energy rates are lower. A conventional system for energy management may be a computer system housed in the basement of a facility or factory, that permits a person to view the energy usage of various equipment within that particular facility and makes changes to the energy usage based on information received at the computer system.

The problem of energy management is especially complex for large entities, such as corporations, universities, municipalities, etc., which may have a physical plant with many different facilities or factories located at various different locations. With a conventional energy management approach, each facility owned by the large entity may independently manage its own energy. Thus, for a large entity, there must be a conventional energy management system associated with each facility or factory, which greatly increases the overall cost of conventional energy management. In addition, each energy management system may use a slightly different data structure for the data being generated so that these multiple energy management systems cannot be easily integrated into a single energy management system for the entire physical plant.

In most conventional systems, the task of energy management is separated from the task of facilities management. Thus, each facility generally has both an energy management system and a facilities management system. To reduce the costs of the management of the facility, it is desirable to integrate these two systems into a single system.

Therefore, it is desirable to provide a single integrated energy and facilities management system which connects a physical plant with multiple, possibly geographically dispersed, facilities or factories together so that the task of energy and facilities management may be accomplished at a single central location. The single control location may be remote from all of the facilities. It is also desirable to provide an energy and facilities management system which provides the user of the system with a simulation of the facilities being managed so that the user may view the physical plant without actually being at the site. Thus, it is desirable to provide an energy management system and method which provides the above advantages and avoids the problems with the conventional systems, and it is to this end that the present invention is directed.

SUMMARY OF THE INVENTION

In accordance with the invention, an energy and facilities management system is provided for energy users with large physical plants which provides these energy users with a comprehensive understanding of the energy consumption of their physical plant and with the ability to manage it in a way that makes sense for their business. The system accomplishes this goal by using, for example, three dimensional facilities navigation tools, powerful energy consumption analysis processes, TCP/IP communication capabilities and a World Wide Web (WWW)-based interface. The system therefore present large amounts of real-time energy data to users in a clear, concise and useful format. The system permits the user to alter energy consumption patterns and/or procure power more intelligently in order to save money. To accomplish the real-time movement of the large amounts of energy data, the system may include a robust, scaleable real-time data server component and a scaleable database which allows for flexibility and ease of integration between products and modules. The real-time server permits the system to provide a web-based interface which allows multiple users from a variety of locations to access important energy information at a much lower cost versus existing energy management systems.

The system, in accordance with the invention, may be divided into one or more sub-systems which manage different portions of the physical plant of the entity. For example, there may be an energy manager, a facility navigator, a facility manager and an alarm manager in a preferred embodiment of the invention. Each of these sub-systems performs operations which permit an employee of the entity to control and manage its facilities including its energy consumption. For example, the energy manager may track and/or analyze energy usage data, the navigator may permit the user to visualize each facility through a simulation, the facility manager may analyze control problems, and the alarm manager may notify the user of alarms and respond to alarms as appropriate. Each of these sub-systems work together to provide an integrated energy and facility management system.

In accordance with another aspect of the invention, a system and method for moving data between the various sub-systems within the energy management system is disclosed. The data moving method concatenates data at one or more sources such that the total amount of data being communicated between the sub-systems is reduced.

Thus, in accordance with one aspect of the invention, a system for managing the facilities and the energy consumption of a physical plant is provided in which the physical plant has one or more facilities and buildings in which each building and facility has one or more devices which operate and consume energy. To accomplish the management of the physical plant, the system may gather information about the energy consumption and operation of each device in the physical plant and control the facilities, buildings and devices in the physical plant, based on the energy consumption and operating information for each device, by communicating the energy consumption and operating data in real-time between the devices and the energy and facility management apparatus. The system may also include a user interface for requesting energy consumption and operation data about one or more devices and for viewing the energy consumption and operation data about the physical plant. A method for energy and facility management is also provided.

In accordance with another aspect of the invention, an apparatus for managing the facilities and energy consumption of a physical plant including one or more pieces of equipment and one or more facilities is provided in which data is received from each facility corresponding to building control signals, energy usage signals and weather data and external data is received corresponding to energy rates and weather forecasts. The apparatus may generate energy management data for the facilities and equipment in the physical plant based on the facility data and the external data. It may also generate a representation of each facility in the physical plant so that a user navigates through each facility. The apparatus may also generate facility management data to help a user of the apparatus control the facilities of the physical plant.

In accordance with another aspect of the invention, a system for communicating data in real-time between an energy and facility management system and the devices of a physical plant is provided in which a plurality of devices in the physical plant operate and consume energy. The system may include a device interface connected to one or more of the devices for gathering energy consumption and operation data about the one or more devices connected to the device interface and a server connected to the device interface for storing the energy consumption and operation data for each device in the physical plant. The system may further include a plurality of client applications which request to receive energy consumption and operation data about one or more devices in the physical plant from the server, and a concentrator connected to one or more of the client applications. The concentrator may analyze the requests for data from the client applications, combine requests for energy consumption and operation data about a particular device into a single combined request, communicate the single combined request to the server, and route the energy consumption and operating data about the particular device received from the server to each client application which requests the energy consumption and operation data about that particular device.

BRIEF DESCRIPTION OF THE DRAWINGS

FIG. 8 is a diagram illustrating the real-time data structures for the server in accordance with the invention.

DETAILED DESCRIPTION OF A PREFERRED EMBODIMENT

The invention is particularly applicable to an energy and facility management system for an energy user having a widely dispersed enterprise with widely dispersed energy consuming factories or facilities. The energy and facility management system may use a public global communications network known as the Internet/Intranet to communicate data between the elements of the system. It is in this context that the invention will be described. It will be appreciated, however, that the system and method in accordance with the invention has greater utility, such as to other smaller, less complex physical plants and may use a variety of communications systems, including a private network, to communicate the data.

Figure 1:
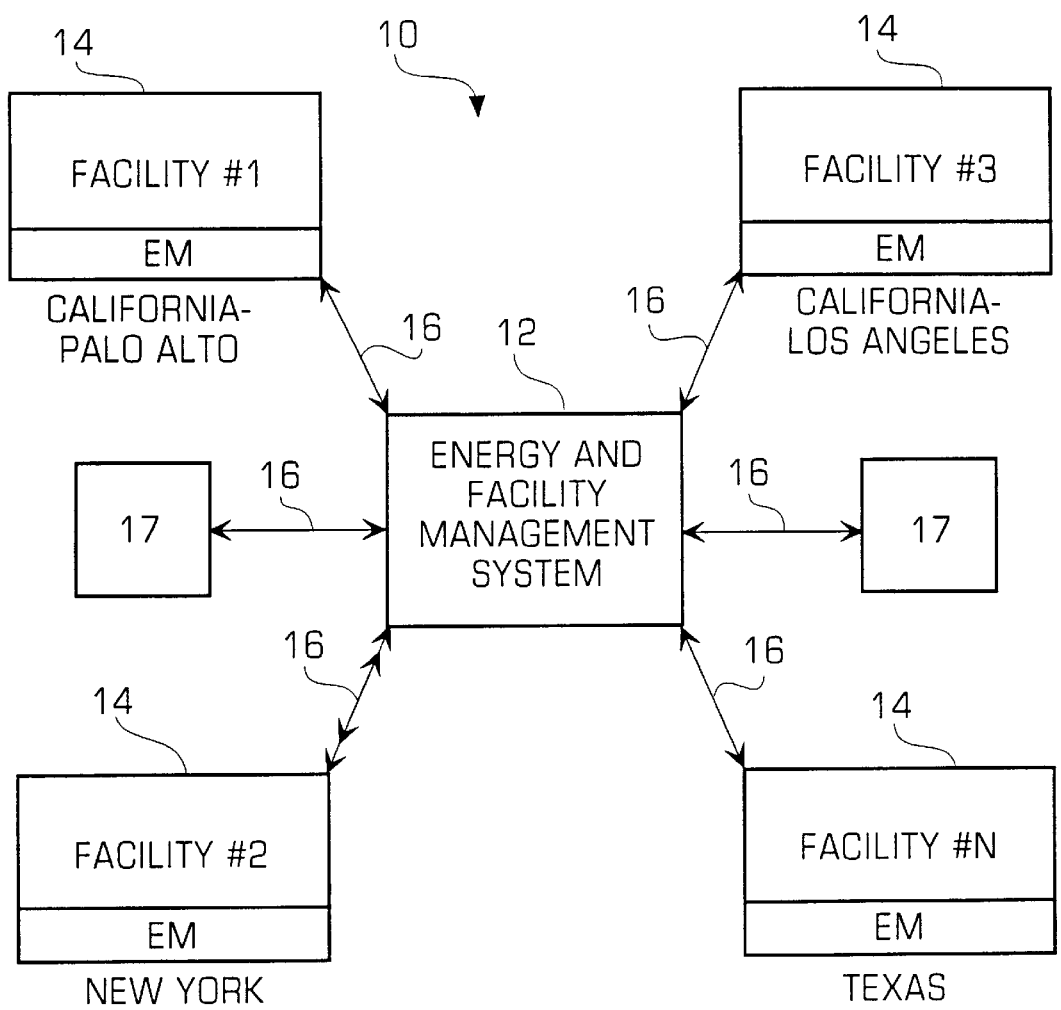
FIG. 1 is a diagram illustrating a geographically diverse enterprise having one more facilities and an integrated energy and facilities management system.

FIG. 1 is a block diagram illustrating a physical plant 10 of a large entity which may be controlled and managed by a central energy and facilities management system 12 in accordance with the invention. As shown, the physical plant of the entity may include one or more facilities 14 (Facility #1, Facility #2, Facility #3 and Facility #N) each of which consumes power and has facilities management requirements. In this example, these facilities may be located in widely disparate geographic locations, such as Palo Alto, Calif., Los Angeles, Calif., New York and Texas. It should be noted that the invention, however, is not limited to any particular number of facilities or the locations of those facilities since the system may also be used for an entity with just a few facilities in the same geographic location. As described above, it is desirable to be able to control and manage the energy consumption and other facilities problems from a single centralized location.

To provide a centralized energy and facilities management system, the system 12 may be interconnected to the facilities 14 by any conventional communications systems 16. In a preferred embodiment, the system 12 and the facilities 14 may be interconnected by the Internet/Intranet. The communications system permit data to be communicated between the facilities 14 and the energy and facilities management system 12 in real-time. To provide an interface between the energy and facilities management system 12 and each facility 14, each facility may include an energy management device (EM) for communicating data between the energy and facilities management system 12 and the facility 14 as described below in more detail. In particular, the combination of the system 12 and the EM devices permit real-time data to be communicated between the system 12 and the facilities 14. In accordance with the invention, a user at the energy and facility management system 12 may control and manage each of the facilities without necessarily being on-site at any of the facilities. The energy and facilities management system 12 may permit, for example, the energy usage of each facility to be monitored and an alarm sounded if a predetermined condition occurs. Because the energy and facility management system 12 is connected to the facilities 14 by a communications system 16, the energy and facility management system 12 may be located at any geographic location while providing complete control and management of all of the facilities in the physical plant 10. In addition to the facilities 14, one or more user terminals 17 may also be connected to the system 12 by the communications system 16, which may preferably be the Internet/Intranet. These terminals 17 may be located at any location where access to the communications system 16 is available. For example, a manager may access real-time energy data from a facility in Singapore while in New York. In addition, there may be multiple people at various different locations accessing different or the same energy data at the same time due to the real-time data retrieval and dissemination system as described below in more detail. Thus, anyone in the entity may access any energy data about the physical plant at any time. The actual data displayed to each user may be customized based on the user's needs so that each user may receive different data or the same data presented in a different way. For example, a CFO may receive a different set of data than an energy manager. Now, the energy and facilities management system 12 will be described in more detail.

Figure 2:
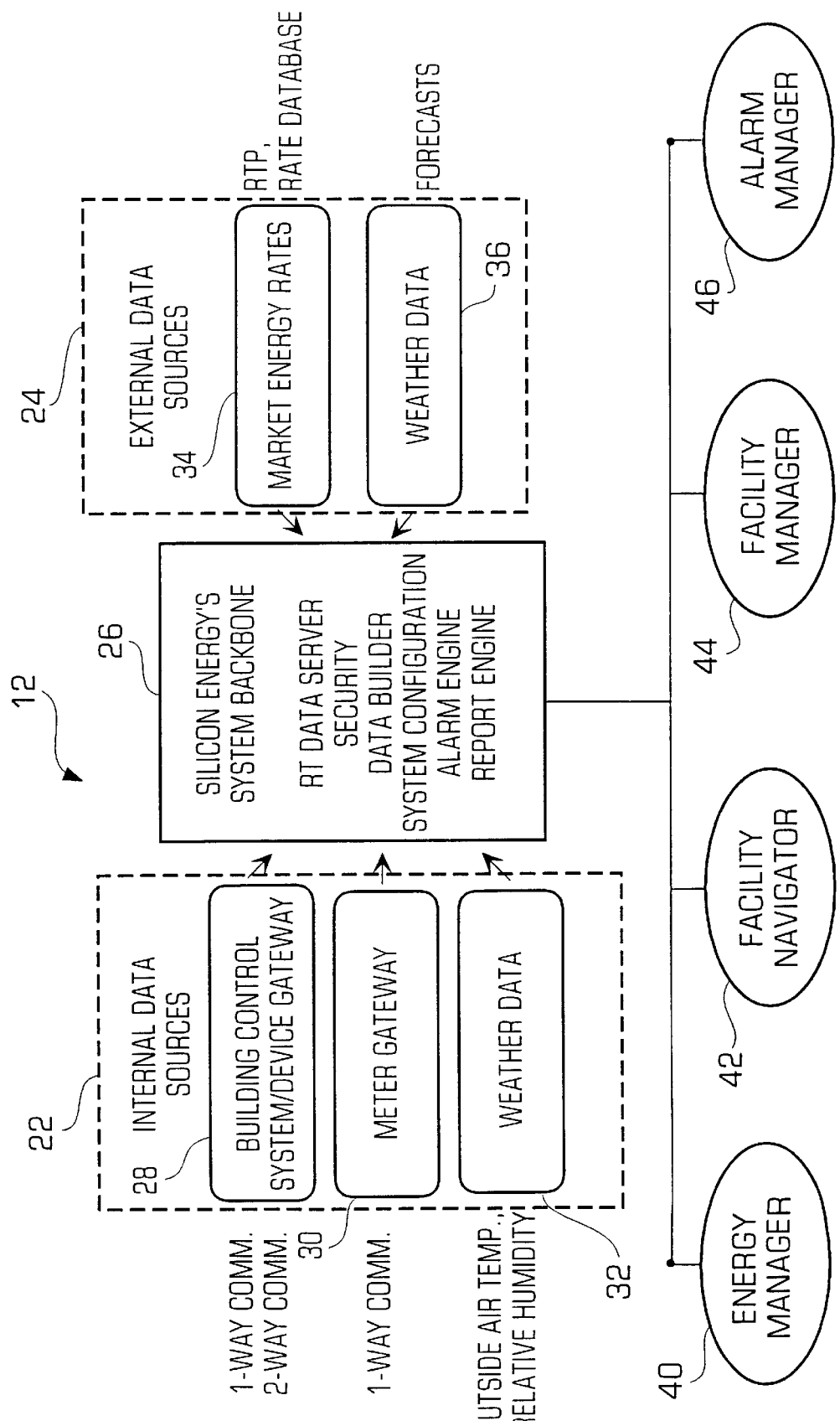
FIG. 2 is a block diagram illustrating an energy and facility management system in accordance with the invention.

FIG. 2 is a block diagram of the energy and facilities management system 12 in accordance with the invention which provides energy and facilities management capabilities for a physical plant. The system may include one or more internal data sources 22, one or more external data sources 24 and an energy and facility management apparatus 26. The internal data sources 22 may be devices internal to the facility which generate data about the facility used for energy and/or facility management. For example, the internal data sources may include a building control gateway 28 which provides one or two-way data communications between the existing controls of the facility and the apparatus 26, a meter gateway 30 which provides data to the apparatus 26 about the energy usage of the facility, and a weather gateway 32 which provides various weather data, such as humidity or temperature, to the apparatus 26. The external data sources may be data sources which are outside of the particular facility, but which also provide data which is useful for energy and facility management. For example, the external data sources may include a market energy rates source 34 which contains data about the energy costs for various energy providers and a weather data source 36 for providing future weather forecasts for each facility. Using the various data from the internal and external data sources 22, 24, the energy and facility management apparatus 26 may, for example, track energy usage or change energy usage patterns based on the forecast weather or based on a less expensive energy provider. The various energy management processes will be described below in more detail.

The apparatus 26 may be a computer system which executes a plurality of different software packages which implement the functions of the system which are described below. As shown, the apparatus 26 may include an energy manager 40, a facility navigator 42, a facility manager 44 and an alarm manager 46. Thus, the apparatus may be divided up into four components and a customer may select features from some or all of these components to create a product bundle that most closely fits their needs. The invention, however, is not limited to an apparatus which includes all of these components and thus the invention may include only one or more of the components. Each of these components may be implemented as a piece of software being executed by a server computer, for example. Each of these components will now be described in more detail.

The energy manager 40 gathers energy usage data and permits users of the system to view and analyze energy usage over any combination of facilities or time periods. The energy manager may permit the user to diagnose energy usage problems and develop strategies to reduce energy costs by optimizing responses to queries by the user based on the time of day, the current energy rate and environmental conditions. The energy manager may receive data from a variety of sources, such as utility meters in the facility. The energy manager may perform a variety of functions, such as tracking energy usage, analyzing energy usage by analyzing historical energy usage data or analyzing energy load aggregation data, energy rate analyzing, energy usage forecasting based on various data such as forecast weather conditions, power procurement analyzing, such as generating a request for purchase (RFP), analyzing the energy usage of different sites and comparing the sites to each other and alarm signaling. In more detail, the usage tracking may include monitoring and generating trends for real-time energy usage of each facility in various energy units, such as kilowatts (KW), kilowatt hours (KWH), or British thermal units (BTUs). The usage tracking may also include aggregating energy loads for the various facilities and retrieving and comparing historical energy usage with real-time energy usage. The energy usage analysis may include an energy load shape analysis, a peak energy demand determination, an identification to determine the largest energy consumers and/or the consumers who use the energy during the peak energy usage time, and a determination of energy load and energy power factors as is well known. The rate analysis may include determining energy costs based on existing rates on a per meter, per building, per site, per cost center or corporate wide basis, an energy load scenario builder in which different energy rates scenarios may be played out to determine the best rate for the entity compared to a base scenario, generating energy bills, and viewing real-time and historical energy demand levels on a per meter, per building, per site, per cost center or corporate wide basis. The usage forecasting may use weather data to forecast a future day, week, month or year's energy usage. An alarm signaling function may generate an alarm signal when certain conditions occur, such as energy load peaks, power spikes, surges, sags and deviations from an acceptable signal quality and keep track of the total number of alarms. Now, the facility navigator 42 will be described in more detail.

The facility navigator 42 may permit any user of the energy and facility management apparatus 26 who is connected to the apparatus by the communications system 16 (see FIG. 1) to view real-time two-dimensional or three-dimensional representations of any facility in the physical plant, to configure a particular site, to analyze and locate energy or facility management problems at a site, or to generate a report. In particular, the facility navigator may permit a user to navigate and analyze problems at multiple sites using advanced 2-D and 3-D visualization tools. In more detail, the two-dimensional navigator may generate graphical representations of the details of the facilities, sites and the like to permit the user to navigate through all of the sites, through a site to a specific building on a site, or through a particular building on a site. The navigator may also generate visual representations of an event, such as an alarm or excessive power usage, so that the user may see these events when they are navigating through the site or building. As an example, the navigator may display a particular building as red indicating that the building is using too much power based on past history and the user of the navigator will see the red building and may investigate the problem. The navigator may also permit the user to look at individual systems in a building, such as HVAC system or equipment components, to analyze a problem. The three-dimensional navigator may perform similar functions as the two-dimensional navigator, but in three-dimensions. The site configuration functions permits the user of the apparatus to customize, create or update a particular site to add various information. For example, the site configuration may permit the user to generate a site map for a newly opened facility which is going to be managed by the apparatus 26.

The facility manager 44 may integrate existing building control systems to permit the user of the apparatus to have access to data from the existing building control systems as well as newly installed systems so that the apparatus 26 may be easily integrated with existing systems. The facility manager may perform data monitoring and collection processes which may include monitoring, trending and archiving data (i.e., temperatures, pressures, flows, levels, set points and states) about existing systems, such as HVAC systems, boilers, chillers, cooling towers, generators, compressors, motors and pumps and lighting. The facility manager may also monitor and trend (i.e., determine a trend and how the particular quantity will act in the future)

environmental conditions, such as lighting, interior and exterior temperatures, relative humidity, solar radiation and the like. The facility manager may also monitor and display peak facility operating periods. The facility manager may also analyze equipment efficiencies under partial and full load, develop operating efficiency load profiles, track operating hours and benchmark load profiles against capacity ratings. The facility manager may also optimize the existing systems by, for example, balancing HVAC operating times to meet building use periods and environmental changes, and optimize existing equipment's usage. The facility manager may also control the existing systems and devices and initiate soft starts, hard starts and stops of the equipment, program control set-points and provide a manual override of the systems and equipment.

The alarm manager 46 handles any alarms generated at any point in the apparatus 26 or physical plant 10. For example, it may collect alarm information from the energy manager or the facility manager and then prioritize these alarms. The alarm manager may also notify the appropriate people, by various different methods, such as e-mail, fax or pager, who need to respond to a particular alarm. Now, the flow of data through the energy management system in accordance with the invention will be described with reference to FIG. 3.

Figure 3:
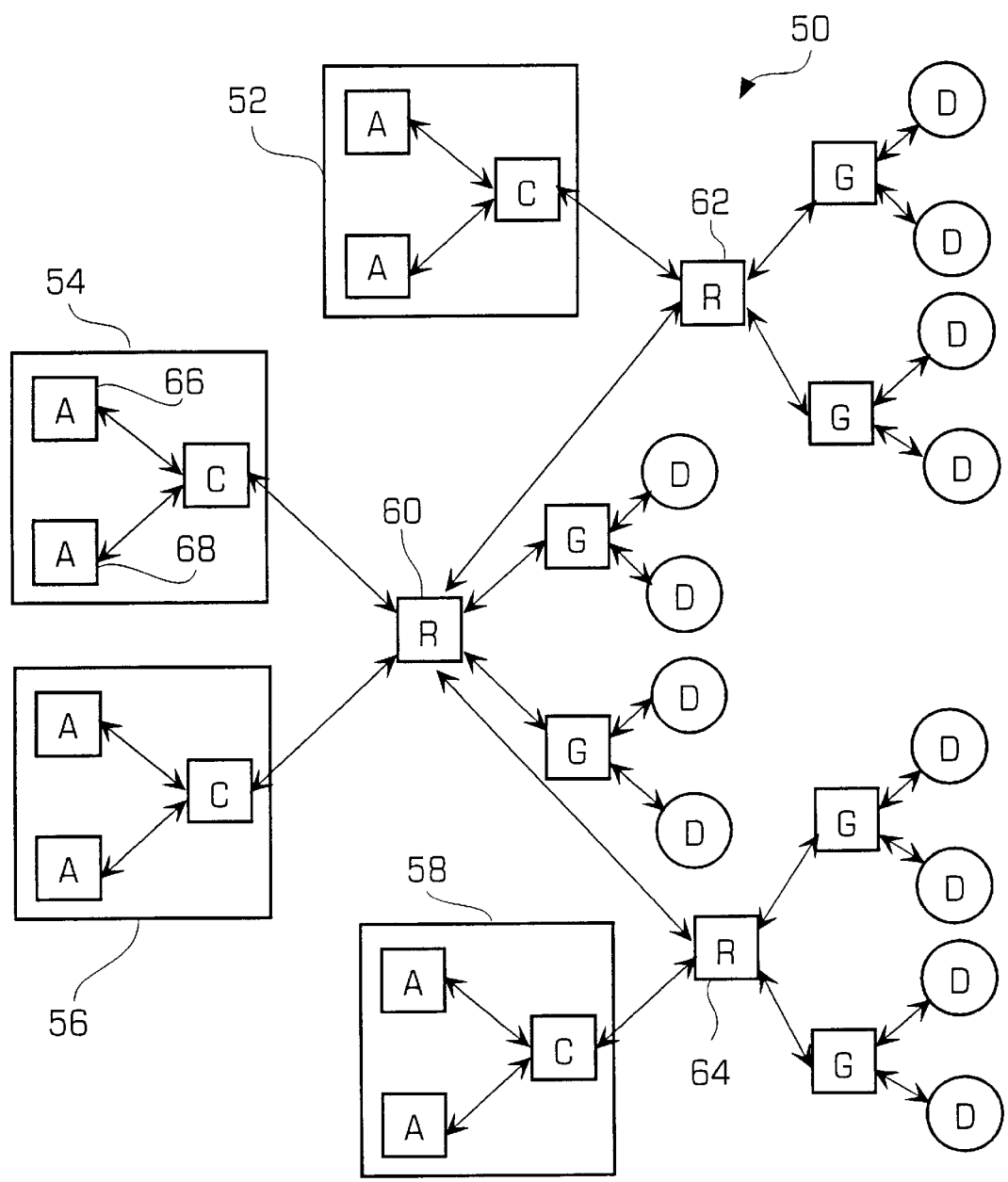
FIG. 3 is a diagram illustrating the data flow through the energy and facility management system shown in FIG. 2.

FIG. 3 is a diagram illustrating an example of a physical plant 50 of a commercial user which may include one or more buildings 52, 54, 56, 58 and additional equipment and devices (D) which may be controlled by the energy management system in accordance with the invention. The energy management system may include one or more computer systems 60, 62, 64 which may be server computers which interconnect the various buildings and equipment of the physical plant for purposes of controlling and managing the buildings and the equipment. In the example shown, the energy management system may include the central server 60 which receives data and information from the other servers, the buildings and the equipment. The invention, however, is not limited to a energy management system with a central server.

At each building, a user executing a client application on a personal computer, for example, may query one of the servers and receive data about some portions of the entity's physical plant. In the example shown in FIG. 3, each client application requesting data about the enterprise may be represented by a client object in an object oriented programming language. Therefore, in accordance with the invention, in order to provide information to a particular client application, the client object corresponding to the client application may be modified and then the client application may read the modified client object. For example, in building 54, a first client application/object 66 and a second client application/object 68 may access information about the physical plant. In the embodiment shown, the client applications may be client software applications being executed on a computer system within the building which access data from the servers. In the preferred embodiment, the client applications/objects may be Internet/Intranet browser software applications which access the servers over the Internet/Intranet to communicate data and commands to the servers. For locations, buildings or sites in which more than one client application is being executed, the energy management system may include a data concentrator (C) which attempts to reduce the data traffic between the client application and the servers by combining requests from the client applications into a single request. For example, if both client applications are requesting the same updated data about a particular piece of equipment, the concentrator may generate a single request for the data and then communicate that updated data to each client application once the updated data is received by the concentrator.

The equipment and devices (D) may be connected to the servers 60–64 by a gateway (G) which acts as an interface between the device D and the servers. In particular, the gateway may be a software application which interprets the particular device or equipment's signals into standardized data which may then be stored by the servers. Therefore, each gateway G may be somewhat unique since it converts signals from a particular device D into a standard format.

In operation, the devices D may generate data about the operation of the device or its energy usage and pass the data to the gateway which forwards it on to the server which stores the data. When a client application requests data about a device, the request is passed to the concentrator associated with the application which filters out any duplicate requests. Then, when a concentrator requests data about the device, the server may communicate the data to the concentrator which passes the data onto the appropriate client application. A similar process may occur to update data about a device. To accomplish the real-time retrieval and dissemination of data, a unique address is assigned to each device and client application in the real-time data retrieval and dissemination system as will now be described.

Figure 4:
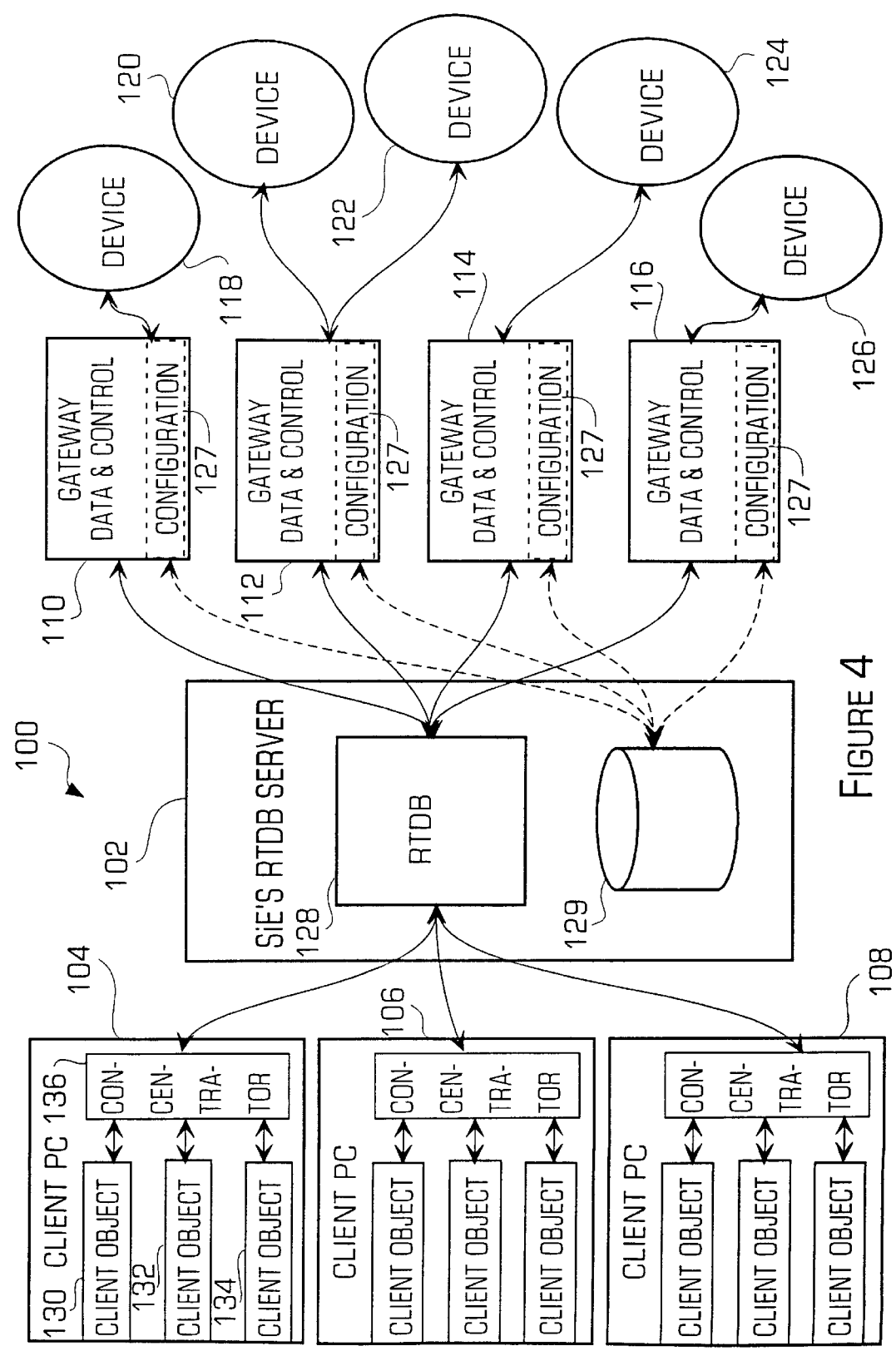
FIG. 4 is a diagram illustrating more details of the real-time data topology of the energy and facility management system of FIG. 2.

FIG. 4 illustrates more details of a real-time data retrieval and dissemination system 100 in accordance with the invention. In a preferred embodiment, the real-time data retrieval and dissemination system 100 may be implemented as a sophisticated software system containing a plurality of software applications which can perform various energy and facility management tasks. For example, the system 100 may remotely interface to various data acquisition and control systems over existing data networks (i.e., an internal computer network or the Internet/Intranet) thereby eliminating the need for proprietary, expensive cabling to remotely locate a control system user-interface software application which permits a user to control and manage the entire physical plant of an organization from one location. In addition, because the system 100 interfaces to and consolidates the data from a variety of different systems having possible different data protocols into a central data server, a user of the system may utilize a common workstation to access and combine the functionality of different control systems from the same location using the same software. As with the equipment and physical plant which may be distributed over a large geographic area, the client software applications, which permit access to the data, may also be located anywhere within the span of the data network. This is especially advantageous since the number and type of client applications requesting for real-time information will grow significantly in the future, as this information becomes integral in optimizing the asset utilization of the enterprise. This permits the system to be scaleable and accommodate future expansion of the physical plant. It also permits the person controlling the physical plant to access data about the physical plant from any location. It also permits other people in the organization, such as the chief financial officer, to access data about the physical plant from his desktop computer which has a browser. In the example shown, the system 100 may include a central server computer 102, one or more client personal computers 104, 106, 108, one or more gateways 110, 112, 114, 116 which connect one or more devices 118, 120, 122, 124, 126 to the server 102. Each of these will now be described in more detail.

The data gateways 110, 112, 114, 116 may be stand-alone software application modules that interface with the devices to perform data acquisition and to control the devices. As shown, multiple control systems or data collection devices of different types may be supported by a single data gateway. The communication medium between the gateway and the data collection device may vary. The data gateways may also be connected to a second data network to permit the gateway to communicate data with the server 102 to perform various functions, such as exchanging collected data or forwarding control commands from the energy management system to individual devices for execution. Each gateway may also include a configuration system 127 for configuring the gateway to a particular device. Now, the server 102 will be described in more detail.

The server 102 is the controller for the real-time data retrieval and dissemination system. The server may be implemented as an individual software process executing on a single computer or as several software processes being executed on a network of multiple computer systems. In either case, the configuration of the server is transparent to the client software application being executed by the client PCs. The distributed server architecture with multiple servers executing various pieces of software may be especially well suited for scaling up the energy management system to handle very large applications of real-time data without affecting any development within the client application. In accordance with the invention, the server may execute software applications which implement the various subsystems described above with reference to FIG. 2. The server 102 may include a real-time database (Rtdb) 128 and a configuration database 129 which communicate with each other. The Rtdb may receive data from the gateways, issue commands to the devices, and disseminate data to the client PCs 104–108. The configuration database 129 may receive configuration data from a gateway for a particular device and forward updated configuration data to a device and gateway. More detail about the operation of the server will be described below.

Each client PC 104, 106 or 108 may include one or more client objects 130, 132, 134 which are connected to a concentrator 136. As described above, the client objects, which may be software applications being executed by the client PC, such as a Internet/Intranet browser, may generate requests for data from the server 102 which the concentrator 136 may combine together if possible. The concentrator 136 thus may act as a data traffic controller to prevent the client objects from overloading the server 102 with duplicate requests. The concentrator, therefore, reduces the data traffic flow between the server 102 and each PC. The client application may consist of one or more stand-alone software application programs or modules that can communicate independently to the server 102 to receive real-time data updates of data element status changes which are displayed visually for the client in a variety of ways, such as using a web browser. Thus, data is automatically updated for each client application as will be described in more detail below. Now, the flow of changed data through the real-time retrieval and dissemination system 100 will be described to better understand the operation of the system.

When a data change occurs on a device 118–126, a data gateway 110–116 attached to the device may detect or be signaled of the data change depending on the capabilities of the device. Once the gateway receives the changed data, it may preprocess the data to standardize it for the energy management system and communicate it onto the Rtdb server 102. Upon arrival of the changed data at the Rtdb server, the Rtdb server checks an update list to determine which concentrators 136 are currently registered to receive data updates for this device. The current list of concentrators which receive the updated data for a particular device changes in real-time based on what data each concentrator is currently requesting or what data is being currently displayed by each client PC.

Once the list of registered concentrators is determined, the Rtdb server may send the updated data to each concentrator 136. When a data update is received by a concentrator, the concentrator may in turn check a local list to see which client applications/objects 130–134 attached to the particular concentrator are registered to receive the particular data updates. Next, the client concentrator may send the data update to each individual client application which updates its display based on the updated data. The client concentrator 136 therefore optimizes the efficiency of the data communication network by concentrating identical point data update registrations from multiple client applications/objects into a single request for data from the Rtdb server. Therefore, data requests by multiple client applications/objects may be serviced by a single data point update message from the Rtdb server which may be referred to as a point concentration process.

The point concentration process extends itself beyond the client objects to the Rtdb server 102 so that the server may act as a hub for all points (devices) that it services from its attached gateways, but in addition act as the hub for points from other Gateways attached to other Rtdb servers. Therefore, any client application/object that needs real-time updated information from any Gateway will receive that data from a local Rtdb server, who in turn is responsible for obtaining that information from other Rtdb servers, if necessary. To accomplish this, each server 102 may be viewed as just another concentrator to each "remote" Rtdb server. In other words, for data requested from another server, each server may concentrate multiple data requests for concentrators and client applications attached to it into a few data requests to reduce data traffic. Thus, the Rtdb server exhibits the same network optimization strategies as the client concentrator objects by concentrating identical point update registrations from multiple concentrators into a single registration to the remote Rtdb server.

Throughout the system 100, registrations (requests) for real-time point (device) updates are initiated by client applications/objects by specifying a unique machine identifier and a unique point identifier combination for each device/point of interest to its associated concentrator. Thus, each server (machine identification) and device/point (point identification) has a unique address so that data may be efficiently routed through the communications network. For example, a client application attached to server A may request data from a device B by issuing a command indicating that A requests data about B so that the command contains the necessary addresses used by the concentrator and other server to route the data about device B to the client application attached to server A. The concentrator then registers these points, if not already registered, with a local Rtdb server. Based on the machine identifier associated with each registered point, the Rtdb server can then pass a registration onto another Rtdb server if necessary, again, only if this point has not already been registered with that Rtdb server. This system of concentrating and forwarding point registrations lends itself to very simplistic administration because each Rtdb server requires no advance knowledge of other Rtdb servers anywhere else in the world as the machine identifier contains all of the information required to locate a Rtdb server. For example, the machine identifier may be composed of a unique TCP/IP address, a unique Uniform Resource Locator (URL), or a unique Domain Name Service (DNS) name which permits each Rtdb server to be individually identified. This process also naturally lends itself to scale up to handle very large real-time data applications.

In summary, to accomplish the real-time data retrieval and dissemination in accordance with the invention, each client application/object is given a unique address, such as that contained in a MachineID variable and each point or device is given a unique address, such as that contained in a PtID variable. Thus, for any data request or any update of existing data, there is an associated PtID or MachineID variable which permits the system to rapidly communicate the data only to the clients which need the information. Now, the operation of the server during a point data update will be described.

Figure 5:
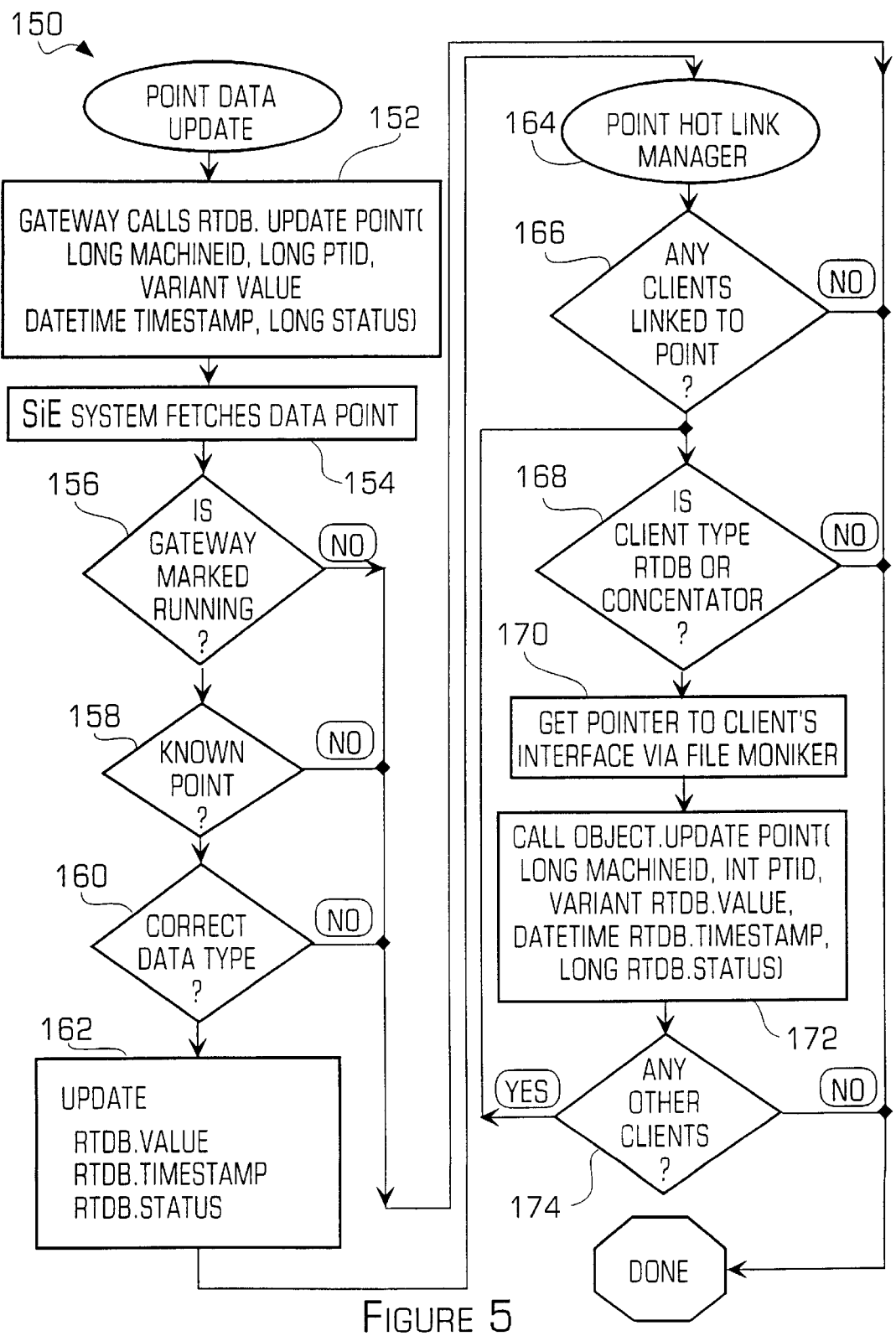
FIG. 5 is a flowchart illustrating a method for updating data in real-time in accordance with the invention.

FIG. 5 is a flowchart illustrating a method 150 for point data updating at the server in accordance with the invention. In step 152, a gateway attached to the device/point with updated data call a Rtdb.UpdatePoint software subroutine which stores values for various variables, such as a machine identification (MachineID), a point identification (PtID), a value of the changed data (Value), a date and time of the data change (DATETIME) and a status of the point/device at the time of the change (status) and passes the values in the variables onto the server. The server, in step 154, then fetches the updated data using the values contained within the subroutine variables from the gateway and stores the values in temporary storage while an authentication process occurs.

In the next series of steps, the server authenticates the data update prior to distributing the data update values to other servers and/or clients. Thus, in step 156, the server determines whether the gateway is marked as running (i.e., whether the server is aware of any problem with the gateway) when the update data subroutine is invoked. If the server detects that the gateway is not running, the data update process ends and no data update is completed. If the gateway is running, then in step 158, the server checks its data records to determine if the point with a data update is actually known to the server since the server maintains a list of the points which are connected to it. If the point is unknown, the method ends and no data update is completed. If the point is known to the server, then the server determines if the updated data from the known point has the proper data type in step 160. If the data type is not correct, the method ends and no data update is completed. Thus, in steps 156–160, the server may authenticate a point data update prior to distributing the data update in order to reduce incorrect data within the system. Thus, each server attached to each point may act as a filter for updated data from that point.

Next, in step 162, the server updates various variables in a real-time (Rtdb)database in the server to reflect the updated data values. In particular, the server may update the values of a Rtdb.Value variable containing the new updated value of the point data, a Rtdb.Timestamp variable containing the time and date information about when the data as updated, and a Rtdb.Status variable containing information about the status of the point when the data update occurred. In the next series of steps, the server may determine the appropriate one or more other servers or concentrators to which the updated point data may be communicated. This process may be referred to as a Point Hot Link Manager shown diagramatically as step 164 in the flowchart.

The Point Hot Link Manager process starts at step 166 in which the server determines, based on a list maintained in the server, which clients may be linked/registered to the particular point which has updated data. If there are no known clients which are registered to receive the updated data, the method ends and the updated data is being retained in the server until a client requests the data. In step 168, the server may determine, from its internal list, whether the particular client is another Rtdb server, a concentrator or something else based on the Machine ID variable. If the client is not another Rtdb server or a concentrator, the method ends. If the client is another server or a concentrator, then in step 170, the server may retrieve a pointer to the particular client's interface from an internal file moniker. Next, in step 172, the server may call an Object.UpdatePoint subroutine which updates various variables, which are described above, in a data structure which is then communicated to the client. In this example shown, a MachineID variable, a PtID variable, a Rtdb.Value variable, a Rtdb.Timestamp variable and a Rtdb.Status variable are updated to reflect the change in the point data. The calling of the subroutine thus updates the values for the particular client as identified by the MachineID variable value so that client automatically receives the updated data anytime an update occurs.

Next, in step 174, the server determines if there are any more clients who are registered to receive the updated data. If there are additional clients who are registered to receive the updated data, the method loops back to step 168 and repeats steps 168–172 to update the data for the next client. Once all of the clients who are registered to receive data updates for the particular point are accounted for, the method ends. In this manner, for each point data update, the server may perform some authentication of the updated data and then proceed to distribute the updated data only to those clients which are registered with the server using the unique addresses as described above. In this manner, the method reduces the amount of data traffic over the communication network. Now, a method by which each client application/object may register itself to receive data updates from a particular point will be described.

Figure 6:
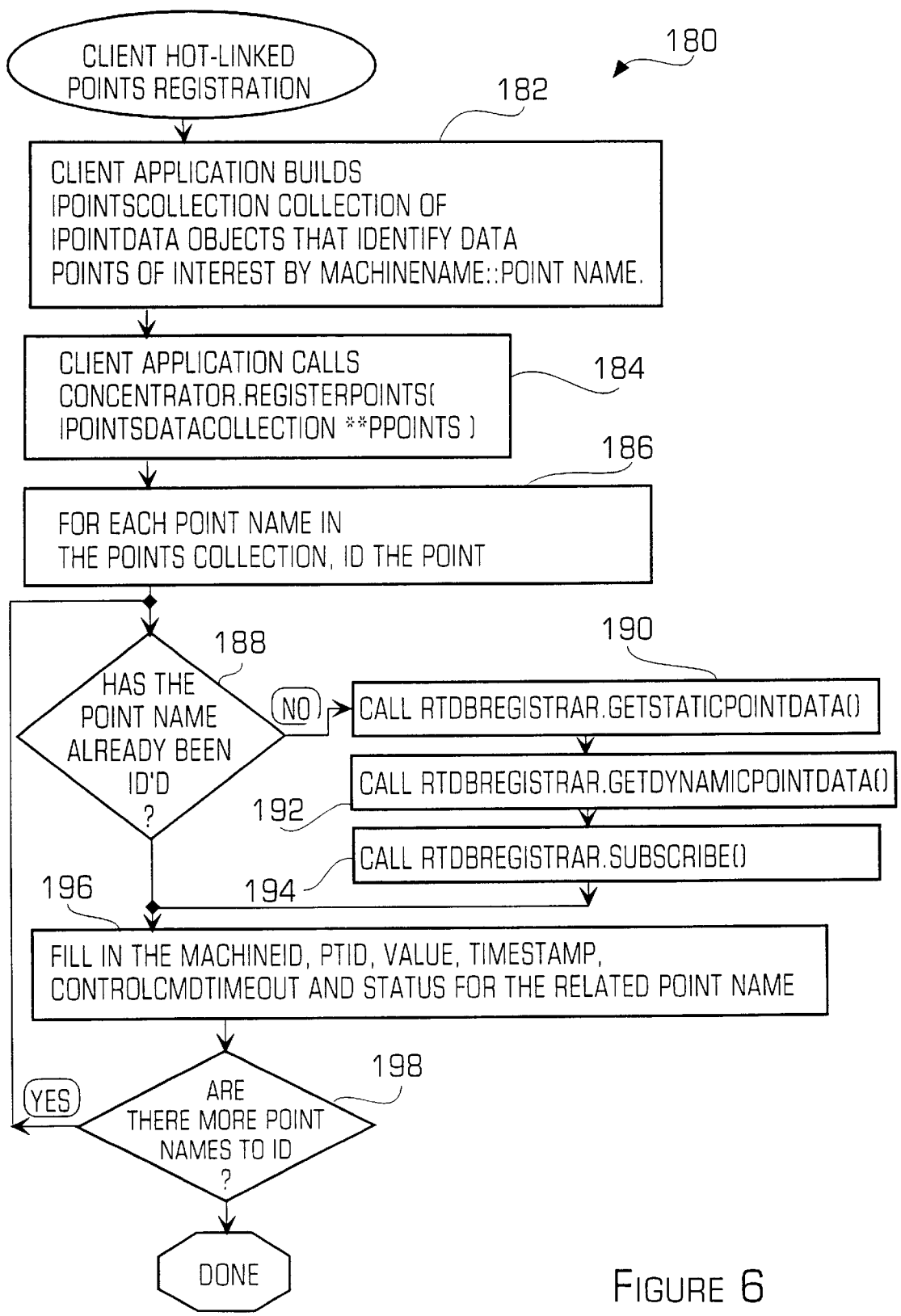
FIG. 6 is a flowchart illustrating a method for registering a client and with a concentrator device in accordance with the invention.

FIG. 6 is a flowchart illustrating a method 180 by which a particular client application may become registered to receive data updates from a particular point/device. In step 182, the client application may identify the points from which the client application wants to receive data. In particular, the client application may build an IPointsCollection data structure containing a collection of the IPointData objects that identify the one or more data points about which the client is interested in receiving data. The data structure may contain a plurality of data structure of the form "MachineName::point name". For example, the user of client application A may be currently viewing the data regarding device/point B and therefore, the client application will enter a data structure of the form "A::B" indicating that the particular client application wants to receive data updates about device B. This data structure may be maintained until the user is no longer viewing the data from device B. Next, in step 184, the client application may call a subroutine to register the request for the data from the particular point with the concentrator connected to the client application. In the example shown, the subroutine may be called with the command Concentrator.RegisterPoints (IPointsDataCollection**pPoints).

In the next series of steps, the concentrator may register the point data requests and determine if a request has already been made for the same point data by either the same client application or another client application connected to the same concentrator. This permits the concentrator to reduce the total data traffic by concentrating requests for data from a particular point by one or more clients into a single data request to the server. The concentrator then distributes the point data to the appropriate client applications. For each point name in the points collection, the concentrator may attempt to identify the point in step 186. In step 188, the concentrator determines if the point has already been identified (i.e., has the concentrator already previously received data or data requests about the point). If the point has not been previously identified, then the concentrator may perform a series of steps to request the data for the particular point from an attached server. Thus, in steps 190, 192 and 194, the concentrator may generate a RtdbRegistrar.GetStaticPointData command to get any static data about the point, a RtdbRegistrar.GetDynamicPointData command to obtain any dynamic data about the point, and a RtdbRegistrar.Subscribe command indicating that the concentrator is registered with the server for the particular point so that the concentrator should automatically receive any updates to the point data as described above.

If the point has already been previously identified (i.e., the concentrator already has the data about the point and any updates), then in step 196, the concentrator may fill in various variables in a data structure with the values for the data for the particular point. In the example shown, the MachineID, PtID, Value, Timestamp, ControlCmdTimeout and Status variables may be filled in to provide the data to the particular client. Next, in step 198, the concentrator determines if there are any other point names to identify and loops back to step 188 if there are additional point names to identify. If there are no other point names to identify, the method is completed. In summary, this method permits a client application to register its need for data about a particular point and permits the concentrator to avoid unnecessary data traffic by combining requests about data from the same point by different clients. Now, a method by which the concentrator receives updated data from a server in accordance with the invention will be described.

Figure 7:
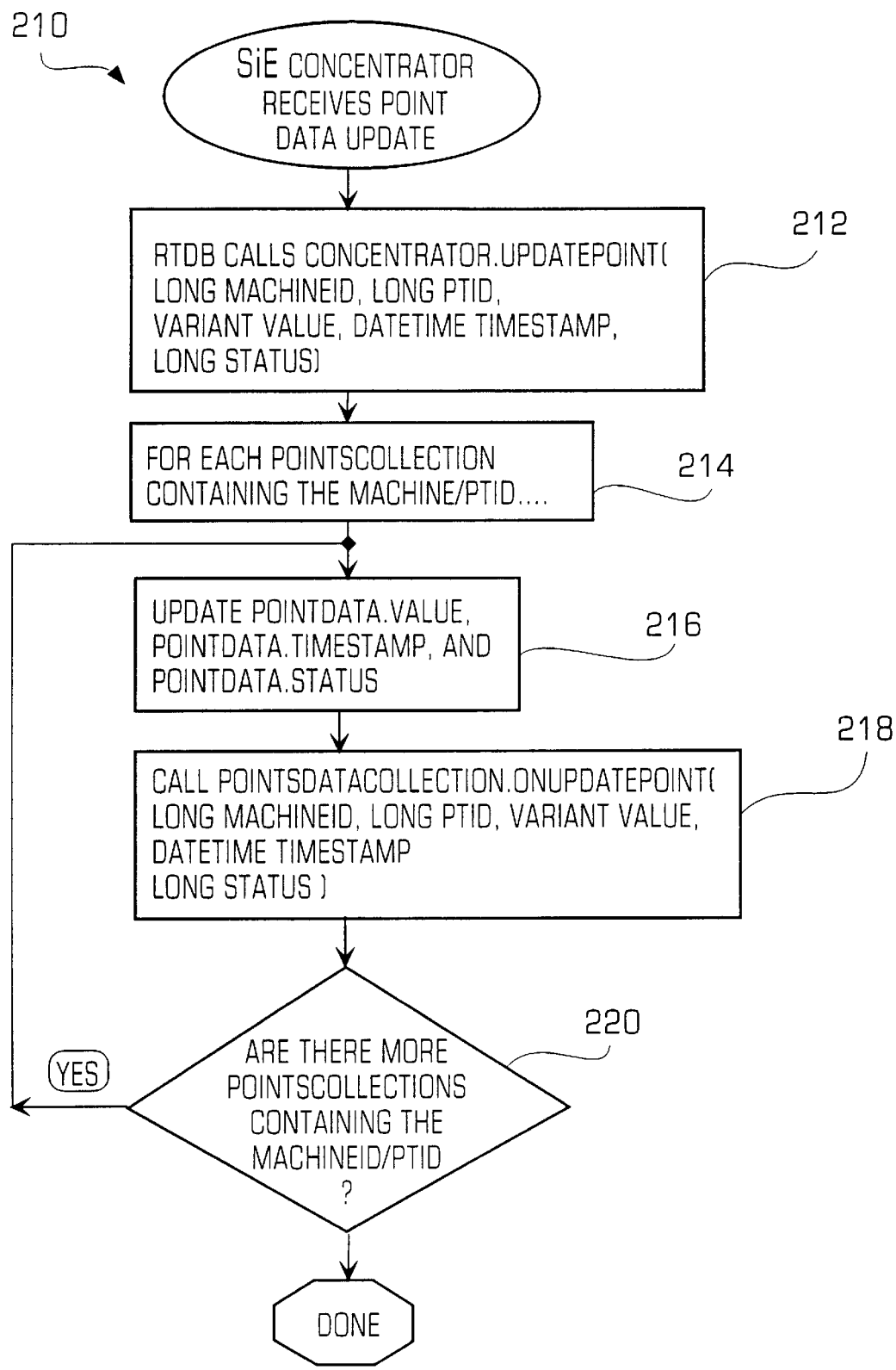
FIG. 7 is a flowchart illustrating the operation of the client and concentrator device in accordance with the invention.

FIG. 7 is a flowchart illustrating a method 210 by which a concentrator receives updated data for a point from a server in accordance with the invention. In step 212, the server calls a subroutine to populate a data structure with the updated data. In the example shown, the subroutine called is "Concentrator.UpdatePoint" and it updates values in a MachineID variable, a PtID variable, a Value variable, a Timestamp variable and a Status variable. Then, in step 214, for each PointsCollection containing the correct MachineID value and PtID value, the server may update the values of the point data by updating (step 216), for example, a PointData.Value, a PointData.Timestamp and a PointData.Status variable. Next, to provide the update to the various clients registered to receive it, the server may call a subroutine, such as PointsDataCollection.OnUpdatePoint, in step 218, to update the MachineID, PtID, Value, Timestamp and Status values in the appropriate variables. Next, in step 220, the concentrator determines if there are any other PointsCollections which contain the same MachineID and PtID values as the current updated data. If there are no other PointsCollections with the same MachineID and PtID values, the method is completed. If there are additional PointsCollections data structure containing the same MachineID and PtID values, the method loops back to step 216 to handle the other PointsCollections. In this manner, when new updated data for a particular point is received by the concentrator, the concentrator then goes through a process to identify clients attached to it which have registered to receive the updated data and passes the updated data onto only the clients which are registered to receive the updated data. Now, an example of the data structures which are utilized by the server in accordance with the invention will be described.

FIG. 8 is a diagram illustrating examples of the various data structures utilized by the server in accordance with the invention. It should be noted that this is only an example of the data structures and the invention is not limited to any particular data structure. As shown, each site of a physical plant may have a site data structure 230 associated with it which may contain a description variable containing a description of the particular site and a SiteID variable containing a unique address for the site. Each location (i.e., building or other location) within a site may have a location data structure 232 which may include a Tag variable containing a unique short name for the location, a LocationID variable containing a unique address for each location, the SiteID variable as described above identifying the site on which the location exists, a description variable containing a description of the locations, such as building 42, a NumFloors variable indicating the number of floors in the building, a SqFeet variable indicating the square footage of the location, a TextureType variable indicating the texture that may be used to render the building during the facility navigation, a DemandThreshold variable indicating when an alarm is generated for a particular reading, and a Group variable indicating a group to which the location belongs. Each data acquisition may have a system data structure 234 associated with it which contains a Description variable containing a description of the particular data acquisition, a SystemID variable containing a unique address for each system, and a LocationID variable, as described above identifying the location of the system.

For each point/device, there may be a StaticPointData data structure 236, a DynamicPointData data structure 238, an Accumulator data structure 240 and a ControlPointData data structure 242. The StaticPointData data structure 236 may contain static data for a particular device/point and may contain a Name variable which stores the name of the Point, a PtID variable containing a unique identification for the point, a SystemID variable as described above indicating the system to which the point is associated, a Group variable indicating a group to which the point is associated, a Priority variable indicating a weighting value for the point, a SortCode variable and a EU variable containing a text string which identifies the engineering unit associated with the particular point. For each point/device, there may also be the DynamicPointData data structure 238 containing dynamic data for a particular device/point. The DynamicPointData data structure may contain a PtID variable as described above, a Value variable indicating a value of the point, a MinValue variable indicating the lowest value for the point over a time interval, a MaxValue variable indicating the highest value for the point over the time interval, an AvgValue variable indicating the average value for the point over the time interval, a Timestamp variable indicating the time and date when the data was entered into the system, a Status variable indicating the status of the point, a PtType variable indicating a type of the point, and an Archive variable indicating if the current data is archived data. Each point may also have the AccumulatorData data structure 240 containing data about an accumulator point in the device. The Accumulator Data may contain the PtID variable, a Delta PtID variable containing a delta value identification for a point, ROCPtID variable containing an identification for the rate of change of the point, and a Delta Multiplier variable containing a multiplier for calculating delta pseudopoints. Each point also has the ControlPointData structure 242 associated with it which contains information about the control of the point including the PtID variable, a CmdTimeout variable indicating an amount of time before a control command is timed out, a CmdInProgress variable indicating if a command is currently in progress, the TimeStamp variable, a two control parameters (Param1 And Param2).

The server may also have an ObjectRegistry data structure 244 to register requests for data. It may include a MonikerName variable containing a file name for each registered client, a MachineName variable indicating the machine that the object is associated with, a hEnsRtdb variable counting a Rtdb handle for each object, an ObjectType variable to indicate the type of the object, and a RunningState variable indicating the current state of the object. The server may also have a RtdbServerRegistry data Structure 246 containing data about the machine hosting the Rtdb server including the MachineName variable indicating the name of the machine hosting the Rtdb server, the MachineID variable indicating the logical address, such as TCP/IP, of the machine, and the hEnsRtdb variable indicating the Rtdb handle for the machine. Thus, using this data structure, the real-time retrieval and dissemination system may uniquely identify and address each server and points.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A system for managing the facilities and the energy consumption of an enterprise of an entity, the enterprise comprising one or more geographically dispersed facilities and buildings, each building and facility having one or more devices which operate and consume energy, the system comprising:

means for gathering information about the energy consumption and the operation of each device, wherein the gathering means further comprises a gateway device connected to one or more of the devices for gathering energy consumption and operation data about the device and for converting the energy consumption and operation data from a device format to a standard format;

an energy and facility management apparatus for controlling the facilities, buildings and devices in the geographically dispersed enterprise based on the energy consumption and operating information for each device, the energy management apparatus comprising means for communicating the energy consumption and operating data in real-time between the devices, the facilities and buildings and the energy and facility management apparatus, the energy and facility management apparatus further comprising a server for processing the standardized energy consumption and operation data about the devices from the gateway to generate energy consumption management and facility management data, a plurality of user interfaces connected to the server, each user interface requesting data about one or more devices in the physical plant, and a concentrator connected to one or more of the user interfaces for interfacing between the user interfaces and the server, the concentrator comprising means for registering requests for data from a particular device by a particular client application, means for combining requests for data from the same device into a single data request from the server in order to reduce the amount of data requests to the server; and a user interface for requesting energy consumption and operation data about one or more devices, facilities or buildings and for viewing the energy consumption and operation data about a predetermined portion of the enterprise.

2. The system of claim 1 further comprising means for generating a representation of a particular selected facility in the enterprise based on the real-time energy consumption and operation data so that a user visually navigates through each facility.

3. A The system of claim 2, wherein the generating means comprises a two-dimensional navigator.

4. The system of claim 3, wherein the generating means comprises a three-dimensional navigator.

5. The system of claim 1 further comprising means for generating facility management data based on the energy consumption and operation data.

6. The system of claim 5 further comprising means for managing alarm signals generated by the facility manager and the energy manager in order to alert the user of the apparatus to alarm conditions in the geographically dispersed enterprise.

7. A method for managing the facilities and the energy consumption of an enterprise of an entity, the enterprise comprising one or more geographically dispersed facilities and buildings, each building and facility having one or more devices which operate and consume energy, the method comprising:

gathering information about the energy consumption and the operation of each device, the gathering further comprising gathering energy consumption and operation data about the device using a gateway device connected to one or more of the devices and converting the energy consumption and operation data from a device format to a standard format;

controlling the facilities, buildings and devices in the geographically dispersed enterprise based on the energy consumption and operating information for each device using an energy and facility management apparatus comprising communicating the energy consumption and operating data in real-time between the devices, the facilities and buildings and the energy and facility management apparatus, the controlling further comprising processing the standardized energy consumption and operation data about the devices from the gateway using a server to generate energy consumption management and facility management data, requesting data about one or more devices in the physical plant by a user interface, and interfacing between the user interfaces and the server using a concentrator connected to one or more of the user interfaces comprising registering requests for data from a particular device by a particular client application and combining requests for data from the same device into a single data request from the server in order to reduce the amount of data requests to the server;

requesting energy consumption and operation data about one or more devices, facilities or buildings using a user interface; and viewing the energy consumption and operation data about a predetermined portion of the enterprise.

8. The method of claim 7 further comprising generating a representation of a particular selected facility in the enterprise based on the real-time energy consumption and operation data so that a user visually navigates through each facility.

9. The method of claim 8, wherein the generating comprises using a two-dimensional navigator.

10. The method of claim 8, wherein the generating comprises using a three-dimensional navigator.

11. The method of claim 7 further comprising generating facility management data based on the energy consumption and operation data.

12. The method of claim 11 further comprising managing alarm signals generated by the facility manager and the energy manager in order to alert the user of the apparatus to alarm conditions in the geographically dispersed enterprise.

13. A system for communicating data in real-time between an energy and facility management system and one or more devices of an enterprise which consume energy, the system comprising:

a device interface connected to the one or more of the devices for gathering real-time energy consumption data and operational data about the one or more devices connected to the device interface;

a server connected to the device interface for storing the energy consumption and operation data for each device in the enterprise into a database, the energy consumption and operation data for each device being identified by a unique device address;

a plurality of client applications, each client application requesting to receive energy consumption and operational data about one or more devices in the enterprise from the server; and a concentrator connected between the server and the one or more client applications, the concentrator comprising means for analyzing the requests for data from the client applications, means for combining requests for energy consumption and operation data about a particular device into a single combined request, means for communicating the single combined request to the server, and means for routing the energy consumption and operating data about the particular device received from the server to each client application which requests the energy consumption and operation data about that particular device.

14. The system of claim 13 further comprising means for generating a representation of a particular selected facility in the enterprise based on the real-time energy consumption and operation data so that a user visually navigates through each facility.

15. The system of claim 14, wherein the generating means comprises a two-dimensional navigator.

16. The system of claim 14, wherein the generating means comprises a three-dimensional navigator.

17. The system of claim 13 further comprising means for generating facility management data based on the energy consumption and operation data.

18. The system of claim 17 further comprising means for managing alarm signals generated by the facility manager and the energy manager in order to alert the user of the apparatus to alarm conditions in the geographically dispersed enterprise.

19. A system for communicating data in real-time between an energy and facility management system and one or more devices of an enterprise which consume energy, the system comprising:

a device interface connected to the one or more of the devices comprising means for gathering real-time energy consumption data and operational data about the one or more devices connected to the device interface and means for storing the real-time energy consumption data and operational data into a database object;

a server connected to the device interface for storing the energy consumption and operation data object for each device in the enterprise into a database, the energy consumption and operation data for each device being identified by a unique device object address;

a plurality of client applications, each client application requesting to receive energy consumption and operational data about one or more devices in the enterprise from the server, each client application having a unique client address; and a concentrator connected between the server and the one or more client applications, the concentrator comprising means for analyzing the requests for data from the client applications, means for combining requests for energy consumption and operation data about a particular device into a single combined request, means for communicating the single combined request to the server, and means for routing the energy consumption and operating data about the particular device received from the server based on the unique client addresses to each client application which requests the energy consumption and operation data about that particular device.

\* \* \* \* \*